United States Patent
Xu et al.

(10) Patent No.: US 8,445,075 B2
(45) Date of Patent: May 21, 2013

(54) METHOD TO MINIMIZE WET ETCH UNDERCUTS AND PROVIDE PORE SEALING OF EXTREME LOW K (K<2.5) DIELECTRICS

(75) Inventors: Huiwen Xu, Sunnyvale, CA (US); Mei-Yee Shek, Mountain View, CA (US); Li-Qun Xia, Santa Clara, CA (US); Amir Al-Bayati, San Jose, CA (US); Derek Witty, Fremont, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/975,833

(22) Filed: Dec. 22, 2010

(65) Prior Publication Data

US 2011/0092077 A1    Apr. 21, 2011

Related U.S. Application Data

(63) Continuation of application No. 11/694,856, filed on Mar. 30, 2007, now abandoned, which is a continuation-in-part of application No. 11/668,911, filed on Jan. 30, 2007, now Pat. No. 7,601,651.

(60) Provisional application No. 60/866,770, filed on Nov. 21, 2006, provisional application No. 60/790,254, filed on Apr. 7, 2006, provisional application No. 60/788,279, filed on Mar. 31, 2006.

(51) Int. Cl.
*B05D 3/10*    (2006.01)

(52) U.S. Cl.
USPC ............... 427/534; 257/E21.211; 427/96.4; 438/4; 438/694; 438/780

(58) Field of Classification Search
USPC ............... 427/96.2, 96.4, 532, 533, 534, 535, 427/544, 569, 574, 578, 579; 438/4, 689, 438/690, 692, 694, 695, 699, 703, 710, 778, 438/779, 780, 787
See application file for complete search history.

(56) References Cited

U.S. PATENT DOCUMENTS

| | | | |
|---|---|---|---|
| 4,980,018 A | 12/1990 | Mu et al. | |
| 5,554,570 A * | 9/1996 | Maeda et al. | 438/763 |

(Continued)

FOREIGN PATENT DOCUMENTS

| | | |
|---|---|---|
| JP | A H05-026654 | 1/2005 |
| JP | A H05-203568 | 7/2005 |

(Continued)

OTHER PUBLICATIONS

Notice to File a Response for Korean Patent Application No. 10-2007-0108170 dated Apr. 13, 2009.

(Continued)

*Primary Examiner* — Michael Cleveland
*Assistant Examiner* — Alexander Weddle
(74) *Attorney, Agent, or Firm* — Patterson & Sheridan, LLP

(57) ABSTRACT

Methods of processing films on substrates are provided. In one aspect, the methods comprise treating a patterned low dielectric constant film after a photoresist is removed from the film by depositing a thin layer comprising silicon, carbon, and optionally oxygen and/or nitrogen on the film. The thin layer provides a carbon-rich, hydrophobic surface for the patterned low dielectric constant film. The thin layer also protects the low dielectric constant film from subsequent wet cleaning processes and penetration by precursors for layers that are subsequently deposited on the low dielectric constant film.

10 Claims, 5 Drawing Sheets

U.S. PATENT DOCUMENTS

| | | | |
|---|---|---|---|
| 5,818,071 A | 10/1998 | Loboda et al. | |
| 5,866,947 A | 2/1999 | Wang et al. | |
| 6,068,884 A | 5/2000 | Rose et al. | |
| 6,147,009 A | 11/2000 | Grill et al. | |
| 6,159,871 A | 12/2000 | Loboda et al. | |
| 6,383,907 B1 | 5/2002 | Hasegawa et al. | |
| 6,451,683 B1 | 9/2002 | Farrar | |
| 6,465,372 B1 | 10/2002 | Xia et al. | |
| 6,486,061 B1 | 11/2002 | Xia et al. | |
| 6,514,671 B1 | 2/2003 | Parikh et al. | |
| 6,528,432 B1 | 3/2003 | Ngo et al. | |
| 6,531,407 B1 | 3/2003 | Huang et al. | |
| 6,547,977 B1 | 4/2003 | Yan et al. | |
| 6,548,899 B2 | 4/2003 | Ross | |
| 6,566,278 B1 | 5/2003 | Harvey et al. | |
| 6,566,283 B1 | 5/2003 | Pangrle et al. | |
| 6,573,572 B2 | 6/2003 | Farrar | |
| 6,582,777 B1 | 6/2003 | Ross et al. | |
| 6,583,046 B1 | 6/2003 | Okada et al. | |
| 6,583,070 B1 | 6/2003 | Tsui et al. | |
| 6,583,489 B2 | 6/2003 | Wang et al. | |
| 6,593,247 B1 | 7/2003 | Huang et al. | |
| 6,632,735 B2 | 10/2003 | Yau et al. | |
| 6,717,265 B1 | 4/2004 | Ingerly et al. | |
| 6,743,732 B1 | 6/2004 | Lin et al. | |
| 6,762,127 B2 | 7/2004 | Boiteux et al. | |
| 6,800,566 B2 | 10/2004 | Lu et al. | |
| 6,825,134 B2 | 11/2004 | Law et al. | |
| 6,846,756 B2 | 1/2005 | Pan et al. | |
| 6,858,923 B2 | 2/2005 | Xia et al. | |
| 6,903,004 B1 * | 6/2005 | Spencer et al. | 438/624 |
| 6,921,727 B2 | 7/2005 | Chiang et al. | |
| 2003/0073321 A1 | 4/2003 | Boiteux et al. | |
| 2003/0077857 A1 | 4/2003 | Xia et al. | |
| 2003/0077916 A1 | 4/2003 | Xu et al. | |
| 2003/0109143 A1 | 6/2003 | Hsieh et al. | |
| 2003/0189208 A1 | 10/2003 | Law et al. | |
| 2003/0232495 A1 * | 12/2003 | Moghadam et al. | 438/623 |
| 2004/0069410 A1 | 4/2004 | Moghadam et al. | |
| 2004/0072436 A1 | 4/2004 | RamachandraRao et al. | |
| 2004/0077164 A1 | 4/2004 | Kornegay et al. | |
| 2004/0214446 A1 * | 10/2004 | Kim et al. | 438/706 |
| 2004/0266216 A1 | 12/2004 | Li et al. | |
| 2005/0003676 A1 | 1/2005 | Ho et al. | |
| 2005/0024630 A1 | 2/2005 | Ohno et al. | |
| 2005/0042889 A1 | 2/2005 | Lee et al. | |
| 2005/0065698 A1 | 3/2005 | Bertrand | |
| 2005/0070128 A1 | 3/2005 | Xia et al. | |
| 2005/0100682 A1 | 5/2005 | Fukiage et al. | |
| 2005/0181623 A1 | 8/2005 | Bencher et al. | |
| 2005/0202685 A1 | 9/2005 | Huang et al. | |
| 2005/0215072 A1 * | 9/2005 | Kevwitch et al. | 438/778 |
| 2005/0230834 A1 | 10/2005 | Schmitt et al. | |
| 2005/0255697 A1 | 11/2005 | Nguyen et al. | |
| 2006/0046427 A1 | 3/2006 | Ingle et al. | |
| 2006/0046519 A1 | 3/2006 | Tsuji et al. | |
| 2006/0154493 A1 | 7/2006 | Arghavani et al. | |
| 2007/0287301 A1 | 12/2007 | Xu et al. | |

FOREIGN PATENT DOCUMENTS

| | | |
|---|---|---|
| KR | 2004-0058955 | 7/2004 |
| KR | 2005-0014231 A | 2/2005 |
| KR | 2006-0059913 | 6/2006 |
| TW | 497140 B | 8/2002 |
| TW | 584672 B | 4/2004 |
| WO | WO-99/41423 | 8/1999 |
| WO | WO-2005/020310 A1 | 3/2005 |

OTHER PUBLICATIONS

Notification of the First Office Action issued Dec. 12, 2008, by the State Intellectual Property Office of the People's Republic of China in Application No. 2007101651423.

International Search Report and Written Opinion of the International Searching Authority dated Nov. 21, 2007 (PCT/US07/65592).

Furusawa, et al., "Oxygen Plasma Resistance of Low-k Organosilica Glass Films" Electrochemical and Solid-State Letters vol. 4 (3), Mar. 2001, pp. G31-G34 (Mar. 2001), Abstract.

First Office Action issued May 13, 2010 in Chinese Patent Application No. 200780012157.4.

Notice to File a Response for Korean Patent Application No. 10-2008-7026336 dated Sep. 6, 2010.

Notification of Rejection issued Dec. 15, 2011, by the Japanese Intellectual Property Office in Application No. 2009-274694.

Taiwan Search Report for Application No. 096111415 dated Mar. 30, 2007.

* cited by examiner under the patents application,continuation-in-part,and provisional patents-related preface and summary.

METHOD TO MINIMIZE WET ETCH UNDERCUTS AND PROVIDE PORE SEALING OF EXTREME LOW K (K<2.5) DIELECTRICS

CROSS-REFERENCE TO RELATED APPLICATIONS

This application is a continuation of U.S. patent application Ser. No. 11/694,856, now abandoned, filed Mar. 30, 2007, which claims benefit of U.S. provisional patent application Ser. No. 60/866,770, filed Nov. 21, 2006, and is a continuation-in-part of U.S. patent application Ser. No. 11/668,911 now U.S. Pat. No. 7,601,651, filed on Jan. 30, 2007, which claims benefit of U.S. provisional patent application Ser. No. 60/790,254, filed on Apr. 7, 2006, and of U.S. provisional patent application Ser. No. 60/788,279, filed Mar. 31, 2006, each of which is herein incorporated by reference. Further, this application is related to U.S. patent application Ser. No. 11/693,005 now U.S. Pat. No. 7,780,865, filed Mar. 29, 2007.

BACKGROUND OF THE INVENTION

1. Field of the Invention

Embodiments of the present invention generally relate to the fabrication of integrated circuits. More particularly, embodiments of the present invention relate to a process for depositing thin layers comprising silicon, carbon, and optionally oxygen and/or nitrogen on low dielectric constant layers.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 µm and even 0.1 µm feature sizes, and tomorrow's facilities soon will be producing devices having even smaller feature sizes.

The continued reduction in device geometries has generated a demand for inter layer dielectric films having lower dielectric constant (k) values because the capacitive coupling between adjacent metal lines must be reduced to further reduce the size of devices on integrated circuits. In particular, insulators having low dielectric constants, less than about 4.0, are desirable.

More recently, low dielectric constant organosilicon films having dielectric constants less than about 3.0 have been developed. Extreme low k (ELK) films having dielectric constants less than 2.5 have also been developed. One method that has been used to develop low dielectric and extreme low dielectric constant organosilicon films has been to deposit the films from a gas mixture comprising an organosilicon compound and a compound, such as a hydrocarbon, comprising thermally labile species or volatile groups and then post-treat the deposited films to remove the thermally labile species or volatile groups, such as organic groups, from the deposited films. The removal of the thermally labile species or volatile groups from the deposited films creates nanometer-sized voids or pores in the films, which lowers the dielectric constant of the films, as air has a dielectric constant of approximately 1.

Ashing processes to remove photoresists or bottom anti-reflective coatings (BARC) can deplete carbon from the low k films and oxidize the surface of the films. The oxidized surface of the low k films is removed during subsequent wet etch processes and contributes to undercuts and critical dimension (CD) loss.

The porosity of the low dielectric constant films can also result in the penetration of precursors used in the deposition of subsequent layers on the films, such as BARC layers or intermetallic barrier layers (TaN, etc.). The diffusion of barrier layer precursors into the porous low dielectric constant films results in current leakage in a device.

Therefore, there remains a need for a method of processing low dielectric constant films that minimizes damage to the films from subsequent processing steps, such as wet etch processes and the deposition of subsequent layers, such as BARC layers and barrier layers.

SUMMARY OF THE INVENTION

The present invention generally provides a method of depositing a thin, conformal pore-sealing surface layer on a low dielectric constant film on a substrate in a chamber. The method comprises removing a photoresist from a patterned low dielectric constant film, and then treating the patterned low dielectric constant film having any aspect ratio or via dimension by depositing a thin, conformal layer having a controlled thickness of between about 4 Å and about 100 Å and comprising silicon and carbon and optionally oxygen and/or nitrogen on a surface of the patterned low dielectric constant film. In one embodiment, depositing the layer comprises reacting octamethylcyclotetrasiloxane in the presence of a low level of RF power. Ashing a photoresist depletes carbon from the surface of the low dielectric constant film, and the surface becomes hydrophilic. The deposited layer recovers the surface carbon concentration of the low dielectric constant film after ashing and provides a hydrophobic surface for the patterned low dielectric constant film. The wet etch rate of a low dielectric constant film is minimized when its surface is hydrophobic. The layer protects the low dielectric constant film from subsequent wet cleaning processes that may be performed on the substrate and prevents undercuts and CD loss. The hydrophobic surface provided by the thin layer prevents moisture adsorption into the low dielectric constant films.

A low dielectric constant film surface becomes oxidized and contains OH groups after photoresist ashing. The surface absorbs moisture and greatly increases the dielectric constant. Deposition of the thin layer after photoresist ashing drives out moisture absorbed in the surface and removes OH groups at the surface of the low dielectric constant film, and thus recovers the low dielectric constant. The deposition of the thin layer provides a hydrophobic sealing layer which prevents further moisture adsorption.

Octamethylcyclotetrasiloxane (OMCTS) is an example of a precursor that may be used to deposit the thin layers described herein. In addition to octamethylcyclotetrasiloxane, precursors having the general formula $R_x$—Si—$(OR')_y$, such as dimethyldimethoxysilane $(CH_3)_2$—Si—$(O-CH_3)_2$, wherein R=H, $CH_3$, $CH_2CH_3$, or another alkyl group, R'=$CH_3$, $CH_2CH_3$, or another alkyl group, x is from 0 to 4, y is 0 to 4, and x+y=4, may also be used to deposit a thin conformal layer with a suitable process window. Other precursors that may be used include linear organosiloxanes. The linear organosiloxanes may include the structure $(R_x$—Si—O—Si—$R_y)_z$, such as 1,3-dimethyldisiloxane $(CH_3$—$SiH_2$—O—$SiH_2$—$CH_3)$, 1,1,3,3-tetramethyldisiloxane $((CH_3)_2$—SiH—O—SiH—$(CH_3)_2)$, hexamethyldisiloxane $((CH_3)_3$—Si—O—Si—$(CH_3)_3)$, etc. Other precursors that may be used include cyclic organosiloxanes $(R_x$—Si—O$)_y$, wherein $R_X$=$CH_3$, $CH_2CH_3$, or another alkyl group, and $R_Y$]H, $CH_3$, $CH_2CH_3$, or another alkyl group. Cyclic organosilicon compounds that may be used may include a ring structure having three or more silicon atoms and the ring structure may further comprise one or more oxygen atoms. Commercially available cyclic organosilicon compounds include rings having alternating silicon and oxygen atoms with one or two alkyl groups bonded to the silicon atoms. For example, the cyclic organosilicon compounds may include one or more of the following compounds:

| | |
|---|---|
| hexamethylcyclotrisiloxane | (—Si($CH_3$)$_2$—O—)$_3$— cyclic, |
| 1,3,5,7-tetramethylcyclotetrasiloxane (TMCTS) | (—SiH($CH_3$)—O—)$_4$— cyclic, |
| octamethylcyclotetrasiloxane (OMCTS) | (—Si($CH_3$)$_2$—O—)$_4$— cyclic, and |
| 1,3,5,7,9-pentamethylcyclopentasiloxane | (—SiH($CH_3$)—O—)$_5$— cyclic. |

The thin layer comprises silicon, carbon, and optionally oxygen. In another embodiment, the precursor may be a silicon and nitrogen-containing precursor that is used to deposit a thin conformal layer comprising silicon, nitrogen, and optionally carbon. The precursor may include linear silazanes and cyclic silazanes. The linear and cyclic silazanes may include the structure $(R_X\text{—Si—NH—Si—}R_Y)_z$, or the structure $(R_X\text{—Si—NH})_Y$, wherein $R_X$=$CH_3$, $CH_2CH_3$, or another alkyl group, and $R_Y$=H, $CH_3$, $CH_2CH_3$, or another alkyl group, x is from 0 to 4, y is 0 to 4, and x+y=4. The cyclic silazanes compounds may include a ring structure having three or more silicon atoms and the ring structure may further comprise one or more nitrogen atoms. Commercially available cyclic silazanes compounds include rings having alternating silicon and nitrogen atoms with one or two alkyl groups bonded to the silicon atoms. For example, the cyclic silazanes compounds may include following:
1,2,3,4,5,6,7,8-octamethylcyclotetrasilazane,
1,2,3,4,5,6-hexamethylcyclotrisilazane,
1,1,3,3,5,5-hexamethylcyclotrisilazane, and
1,1,3,3,5,5,7,7-octamethylcyclotetrasilazane.

The thin, conformal layer can be deposited on any blanket or patterned film containing OH, NH, or $NH_2$ groups at the surface, including dielectric films and metallic films with oxide at the surface (such as Cu/CuO or Al/$Al_2O_3$), as a protective layer to prevent moisture adsorption and wet chemistry etching, or a pore-sealing layer to prevent penetration of precursors or chemicals. The thin layer can also serve as a pore-sealing layer for porous dielectric films or metallic films with OH, NH, or $NH_2$ groups at the surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a method of depositing a thin, conformal layer comprising silicon, carbon, and optionally oxygen and/or nitrogen on a patterned substrate. In one aspect, embodiments of the present invention provide a method of protecting a patterned low dielectric constant film after a photoresist that has been used to pattern the low dielectric constant film is removed from the film. In other aspects, embodiments of the present invention provide a method of controlling the critical dimension of a metal line in an interconnect and a method of controlling the thickness of a deposited layer to between about 4 Å and about 100 Å.

In one embodiment, a low dielectric constant film on a substrate is patterned using a photoresist and photolithography to form a vertical interconnect or a horizontal interconnect opening therein. The low dielectric constant film may be a film comprising silicon, carbon, and optionally oxygen and/or nitrogen. The low dielectric constant film may be deposited from a gas mixture comprising an organosilicon compound, such as an organosilane or organosiloxane. The gas mixture may also include an oxidizing gas. In one embodiment, the gas mixture comprises an organosilicon compound and a porogen, such as a hydrocarbon, that is removed from the film after the film is deposited to create voids or pores in the film and lower the dielectric constant of the film. The porogen may be removed by a UV treatment, electron beam treatment, thermal treatment, or a combination thereof. Methods of forming porous low dielectric constant films are further described in commonly assigned U.S. Pat. No. 6,936,551 and in commonly assigned U.S. Pat. No. 7,060,330, which are herein incorporated by reference. It is noted that low dielectric constant films that have other compositions and/or are deposited from different gas mixtures can be used in embodiments of the invention.

It is also noted that films other than low dielectric constant films can be used in embodiments, such as any films containing OH, NH, or $NH_2$ groups at the surface. Generally, the films that may be used have an oxygen-rich or nitrogen-rich surface that allows the selective deposition of a thin film comprising silicon, carbon, and optionally oxygen and/or nitrogen thereon. As defined herein, an oxygen-rich surface has a Si:O (silicon:oxygen) ratio of between about 1:1 to about 1:3. As defined herein, a nitrogen-rich surface has a Si:N (silicon:nitrogen) ratio of between about 1:1 to about 1:2.

While the films may be deposited on an oxygen-rich or nitrogen-rich surface, the films typically do not grow on carbon-rich surfaces, and thus, the deposition of the films on oxygen-rich or nitrogen-rich surfaces may be described as selective deposition processes.

Figure 1A:
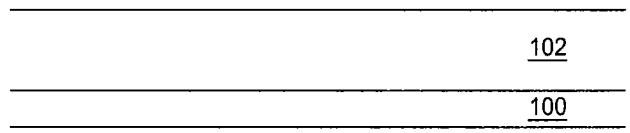
FIGS. 1A-1F depict schematic cross-sectional views of a substrate structure at different stages of a process sequence according to an embodiment of the invention.
Figure 1B:
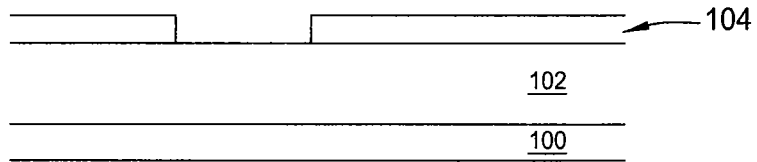

FIG. 1A shows an example of low dielectric constant film 102 on a substrate 100. FIG. 1B shows a patterned photoresist 104 on the low dielectric constant film 102.

Figure 1C:
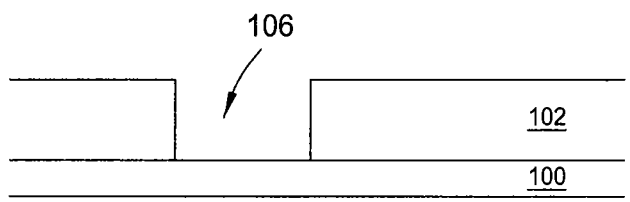
Figure 1D:
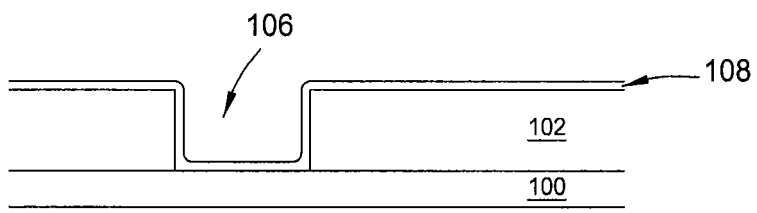

The photoresist is then removed from the low dielectric constant film by stripping or ashing, for example. FIG. 1C shows the low dielectric constant film 102 after it has been patterned by the photoresist 104 to form an interconnect 106 and the photoresist has been removed. A thin, conformal layer 108, i.e., a layer having a thickness of about 4 Å and about 100 Å, comprising silicon, carbon, and optionally oxygen and/or nitrogen, is then deposited on a surface of the patterned low dielectric constant film, as shown in FIG. 1D. The layer may be deposited by reacting a gas mixture, such as a gas mixture comprising silicon, oxygen, and carbon, in the presence of RF power. The silicon, oxygen, and carbon may be provided by an organosilicon compound such as octamethylcyclotetrasiloxane. The organosilicon compound is typically introduced into a chamber with a carrier gas. Preferably, the carrier gas is helium. However, other inert gases, such as argon or nitrogen, may be used.

Figure 1E:
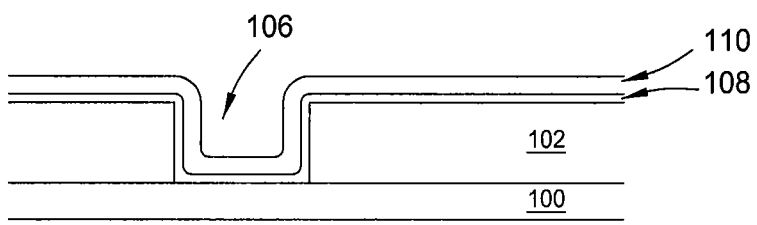
Figure 1F:
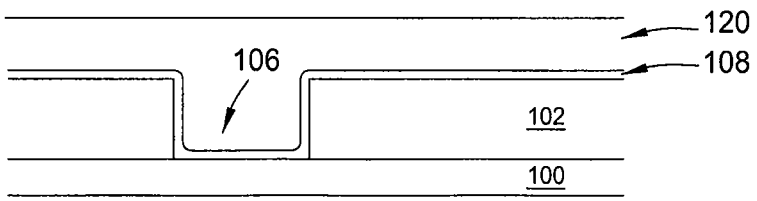

After the layer is deposited, the substrate may be wet cleaned, such as with a 100:1 HF solution. Then, as shown in FIG. 1E, a layer 110, such as a PVD barrier layer or an ALD barrier layer, e.g., an ALD tantalum nitride (TaN) layer, may be deposited on the layer. Alternatively, as shown in FIG. 1F, a layer, such as a barrier anti-reflective coating (BARC) layer 120, may be deposited on the layer 108 and fill the interconnect 106.

The layer comprising silicon, carbon, and optionally oxygen and/or nitrogen may be deposited in a chemical vapor deposition chamber or a plasma enhanced chemical vapor deposition chamber by reacting a gas mixture comprising an organosilicon compound in the presence of RF power. Examples of chambers that may be used to deposit the layer include a PRODUCER® chamber with two isolated processing regions and a DxZ® chamber, both of which are available from Applied Materials, Inc. of Santa Clara, Calif. The processing conditions provided herein are provided for a 300 mm PRODUCER® chamber with two isolated processing regions. Thus, the flow rates experienced per each substrate processing region and substrate are half of the flow rates into the chamber.

During deposition of the layer on a substrate in the chamber, the substrate is typically maintained at a temperature between about 150° C. and about 400° C. RF power is provided at a power level of about 100 W or less, such as between about 30 W and about 75 W, for a 300 mm substrate. Generally, the RF power may be provided at about 0.109 W/cm$^2$ or less, such as between about 0.033 W/cm$^2$ and about 0.082 W/cm$^2$. The RF power may be provided to a showerhead, i.e., a gas distribution assembly, and/or a substrate support of the chamber. The RF power is provided at a high frequency between about 13 MHz and 14 MHz, preferably about 13.56 MHz. The RF power may be cycled or pulsed. The RF power may also be continuous or discontinuous. The spacing between the showerhead and the substrate support is greater than about 200 mils, such as between about 200 mils and about 1400 mils. The pressure in the chamber is about 1.5 Torr or greater, such as between about 1.5 Torr and about 8 Torr.

The organosilicon compound may be introduced into the chamber at a flow rate of between about 100 sccm and about 1000 sccm. A carrier gas may be introduced into the chamber at a flow rate of between about 100 sccm and about 7,000 sccm. The ratio of the flow rate of the organosilicon compound, e.g., octamethylcyclotetrasiloxane (OMCTS, sccm), to the flow rate of the carrier gas, e.g., helium (sccm), into the chamber is about 0.1 or greater. The layer may be deposited for a period of time, such as between about 0.1 seconds and about 600 seconds depending on the aspect ratio of patterned structure, to deposit the layer to a thickness between about 4 Å and about 100 Å. Typically, the layer is deposited for a longer period of time when higher aspect ratios are used in order to provide a conformal surface.

It has been found that using the RF power levels, spacing, pressure, and flow rate ratios described above, a thin, uniform, conformal layer having a thickness of only between about 4 Å and about 100 Å can be reliably deposited when a self-saturating organosilicon compound is used as a precursor to deposit the layer. A 1 Å thickness range of the layer within a single 300 mm substrate has been obtained using the conditions provided herein. As defined herein, a "self-saturating precursor" is a precursor that deposits one thin layer, e.g., only one molecular layer of the precursor disregarding the length of deposition time, on a substrate. The thickness can be controlled by the choice of the precursor, as different precursors have different molecular sizes, resulting in different thicknesses for one molecular layer for different precursors. The presence of the thin layer hinders the further deposition of additional layers from the precursor under the processing conditions used to deposit the thin layer. Generally, the self-saturating precursor may comprise a methyl group that is selected to suppress continued growth of the thin layer. OMCTS is a preferred self-saturating precursor as it contains a large number of methyl groups that result in a self-saturating deposition of a layer, as the carbon in the methyl groups provides a carbon-rich film surface that substantially hinders further deposition thereon. In other words, a conformal first layer may be deposited from OMCTS because as soon as the surface of the underlying substrate is covered with OMCTS molecules, the presence of the Si—CH$_3$ bonds at the surface of the deposited layer provides a carbon-rich surface that hinders further deposition until some of the methyl groups are removed by some other treatment of the layer. Thus, the deposition of each molecular layer of OMCTS can be well controlled, which enhances the step coverage of the final layer.

Other than octamethylcyclotetrasiloxane, precursors having the general formula R$_x$—Si—(OR')$_y$, wherein R=H, CH$_3$, CH$_2$CH$_3$, or another alkyl group, R'=CH$_3$, CH$_2$CH$_3$, or another alkyl group, x is from 0 to 4, y is 0 to 4, and x+y=4, may also be used to deposit a thin conformal layer with a suitable process window. Other precursors that may be used include linear organosiloxanes and cyclic organosiloxane. The linear and cyclic organosiloxanes may include the structure (R$_X$—Si—O—Si—R$_Y$)$_z$, or the structure (R$_X$—Si—O)$_Y$, wherein R$_X$=CH$_3$, CH$_2$CH$_3$, or another alkyl group, and R$_Y$=H, CH$_3$, CH$_2$CH$_3$, or another alkyl group. Examples of precursors that may be used include diethoxymethylsilane (DEMS), hexamethyldisiloxane (HMDOS), and hexamethyldisilane (HMDS). Other precursors containing Si, C, and H may be used in the process, such as trimethylsilane, tetramethylsilane, etc.

X-ray photoelectron spectroscopy (XPS) analysis was performed on low dielectric constant films that had not been exposed to an ashing process and on low dielectric constant films that had been exposed to a photoresist ashing. XPS analysis was also performed on low dielectric constant films that were exposed to photoresist ashing and then treated by depositing a thin layer thereon, with the thin layer being deposited from OMCTS and comprising silicon, carbon, and oxygen according to embodiments of the invention. The XPS analysis showed that depositing the thin layer on the ashed low dielectric constant films provide a higher carbon content (atomic % carbon) at the surface of those films compared to the low dielectric constant films that were not treated by depositing the thin layer thereon. For example, the ashed low dielectric constant films may have about 3 atomic % carbon, while the thin layer on the ashed low dielectric constant films provides about 15 atomic % carbon at the surface. Thus, in one aspect, the thin layer is a carbon-rich layer. The thin layer may have a carbon content of between about 5 atomic % and about 30 atomic %. Ashing depletes the carbon concentration at the surface of low dielectric constant film, while depositing the thin layer on the ashed low dielectric constant film recovers the surface carbon concentration.

Figure 2:
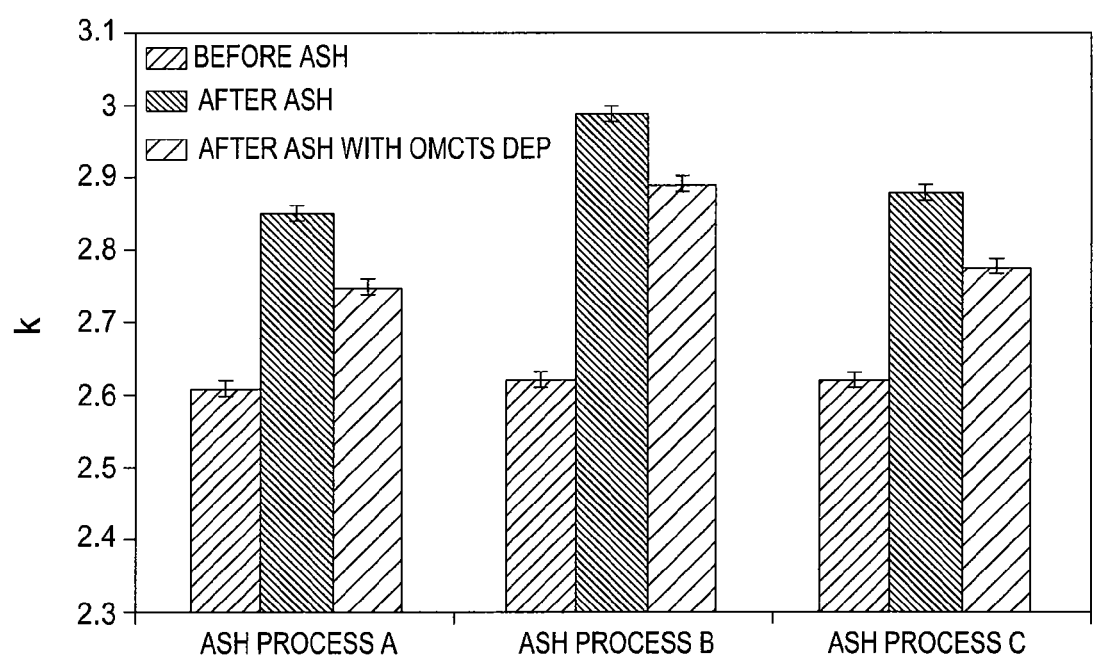
FIG. 2 is a graph showing the dielectric constant (k) of low dielectric constant films before and after ashing and of low dielectric constant films having a thin OMCTS layer deposited thereon after ashing according to an embodiment of the invention.

The XPS analysis also showed that the oxygen content at the surface of the low dielectric constant films treated with the thin layer was lower than the oxygen content at the surface of the low dielectric constant films that were not treated with the thin layer after ashing, as OH groups at the surface of the ashed films was replaced by the thin layer that comprises carbon. The replacement of the OH groups at the surface of the ashed films with the thin layer that comprises carbon also lowers the dielectric constant of the ashed films. FIG. 2 shows that depositing a thin layer using OMCTS on the low dielectric constant films lowered the post-ashing dielectric constant of films subjected to one of three different ashing processes.

Figure 3:
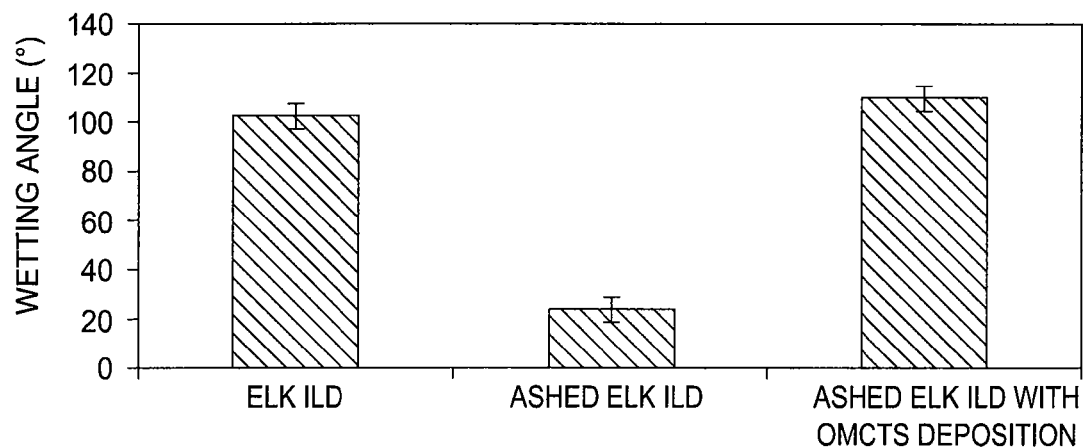
FIG. 3 is a graph showing the wetting angle of low dielectric constant films before and after ashing and of low dielectric constant films having a thin OMCTS layer deposited thereon after ashing according to an embodiment of the invention.

The wetting angle for low dielectric constant films pre- and post-ashing (ELK ILD, i.e., extreme low k interlayer dielectric, and Ashed ELK ILD, respectively, in FIG. 3), and for low dielectric constant films post-ashing and having a thin OMCTS layer (Ashed ELK ILD with OMCTS deposition in FIG. 3) thereon was also measured. The results are shown in FIG. 3. As shown in FIG. 3, depositing the thin OMCTS layer on the low dielectric constant films post-ashing increased the wetting angle of the low dielectric constant films. The increased wetting angle shows that the thin OMCTS layer increased the hydrophobicity of the low dielectric constant films' surfaces. Such an increase in hydrophobicity is desirable, as a hydrophobic surface prevents moisture adsorption into the low dielectric constant films which can affect film performance or at least result in a need for time consuming steps to remove the moisture.

The effect of the deposition of the thin, conformal OMCTS layer on the profile of interconnects after a post ash wet clean was also examined. The trench profiles of regions having high densities of trenches and low densities of trenches in low dielectric constant films with and without the thin OMCTS layer thereon were examined after the films were dipped in a 100:1 HF solution in a wet clean process.

Figure 4C:
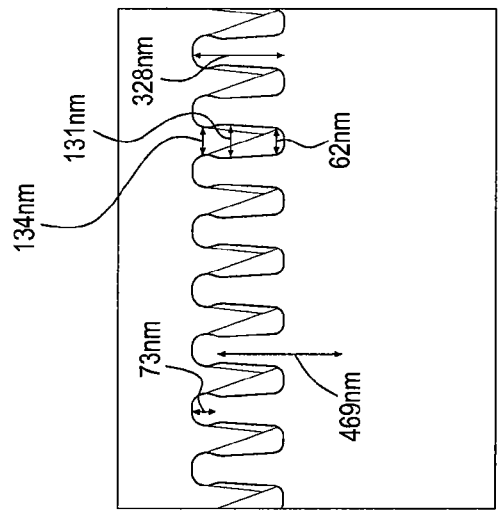
FIG. 4C is a sketch of a trench profile (dense array) after ashing and wet cleaning according to an embodiment of the invention.
Figure 4B:
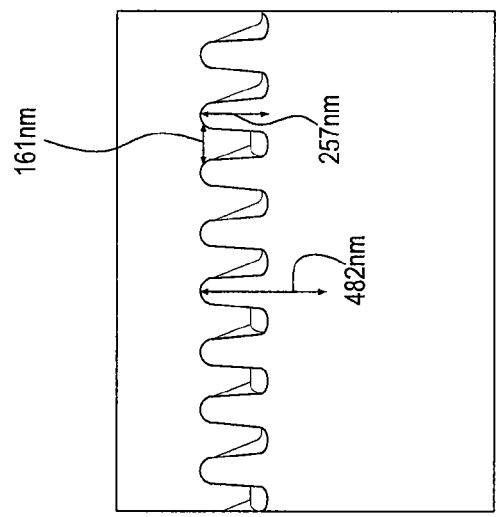
FIG. 4B is a sketch of a trench profile (dense array) after ashing and wet cleaning according to the prior art.
Figure 4A:
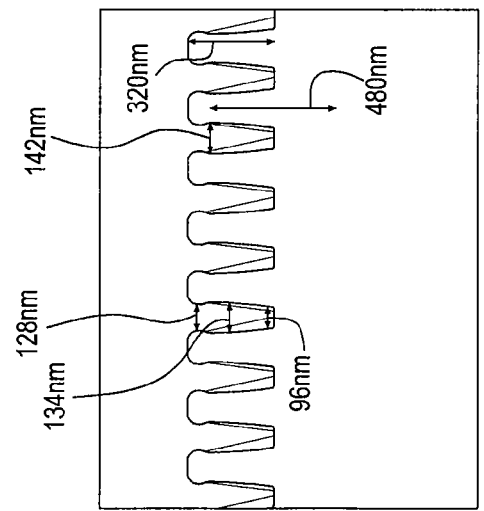
FIG. 4A is a sketch of a trench profile (dense array) after ashing and before wet cleaning according to the prior art.

FIGS. 4A-4C show the trench profiles of regions having a high density of trenches. FIG. 4A shows the trench profile after ashing and before the wet clean. FIGS. 4B and 4C shows the trench profile after ashing and after the wet clean for low dielectric constant films without and with the thin OMCTS layer thereon, respectively. FIG. 4B shows that the wet clean causes a critical dimension loss of about 30 nm for trenches in a low dielectric constant film without the thin OMCTS layer thereon. FIG. 4C shows that such a CD loss was not observed when the low dielectric constant film had the thin OMCTS layer deposited thereon before the wet clean.

Figure 5C:
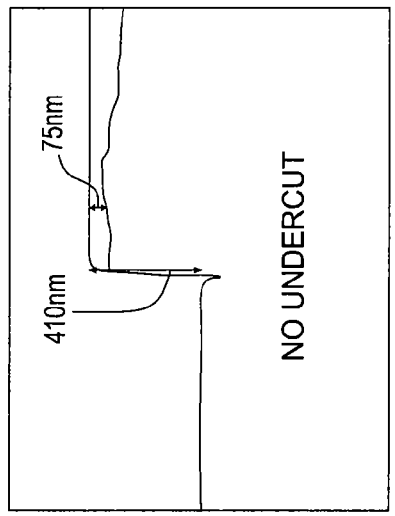
FIG. 5C is a sketch of a trench profile (iso structure/open area) after ashing and wet cleaning according to an embodiment of the invention.
Figure 5B:
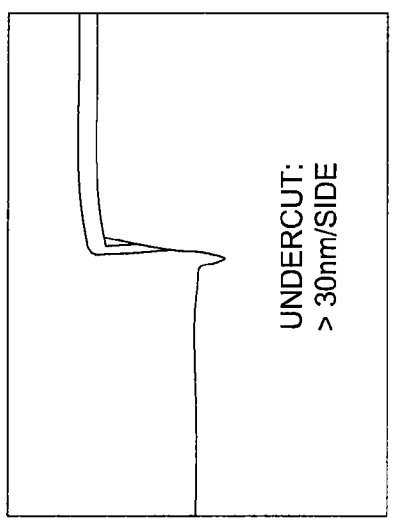
FIG. 5B is a sketch of a trench profile (iso structure/open area) after ashing and wet cleaning according to the prior art.
Figure 5A:
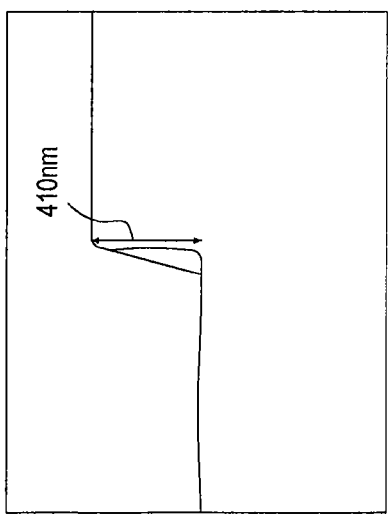
FIG. 5A is a sketch of a trench profile (iso structure/open area) after ashing and before wet cleaning according to the prior art.

FIGS. 5A-5C show the trench profiles of regions having a low density of trenches. FIG. 5A shows the trench profile after ashing and before the wet clean. FIGS. 5B and 5C shows the trench profile after ashing and after the wet clean for low dielectric constant films without and with the thin OMCTS layer thereon, respectively. FIG. 5B shows that the wet clean causes an undercut of greater than about 30 nm for trenches in a low dielectric constant film without the thin OMCTS layer thereon. FIG. 5C shows that such undercutting was not observed when the low dielectric constant film had the thin OMCTS layer deposited thereon before the wet clean.

Thus, the thin OMCTS layer provides a carbon rich surface, which in turn provides a hydrophobic surface that prevents the critical dimension loss and undercutting of the low k films during wet etch processes.

It was also found that the thin layers provided according to embodiments of the invention act as dense, pore-sealing layers that can prevent the penetration of a material, such as a BARC material for a subsequently deposited BARC layer, or a PVD barrier precursor or an ALD barrier precursor, e.g., an ALD TaN precursor, for a subsequently deposited barrier layer, into porous low k films onto which the thin layers may be deposited.

For example, the thin layer may be deposited on a low dielectric constant film after a via etch and photoresist ashing in a via first damascene process. Subsequent BARC filling may be performed on the thin layer. The thin layer provides a pore-sealing layer that prevents the penetration of the BARC material into the dielectric film. A dielectric barrier that is between the low dielectric constant film and an underlying conductive material, such as copper, may then be etched to expose the underlying conductive material after a trench etch and photoresist removal. After the dielectric barrier etching, a reducing chemistry may be used to clean the conductive surface exposed by the removal of the dielectric barrier and to remove an oxide from the surface, such as copper oxide (CuO). The thin layer is then deposited on the sidewalls of the via and trench. The thin layer provides a pore-sealing layer that prevents the penetration of subsequent barrier layer precursors into the low dielectric constant film.

Figure 6:
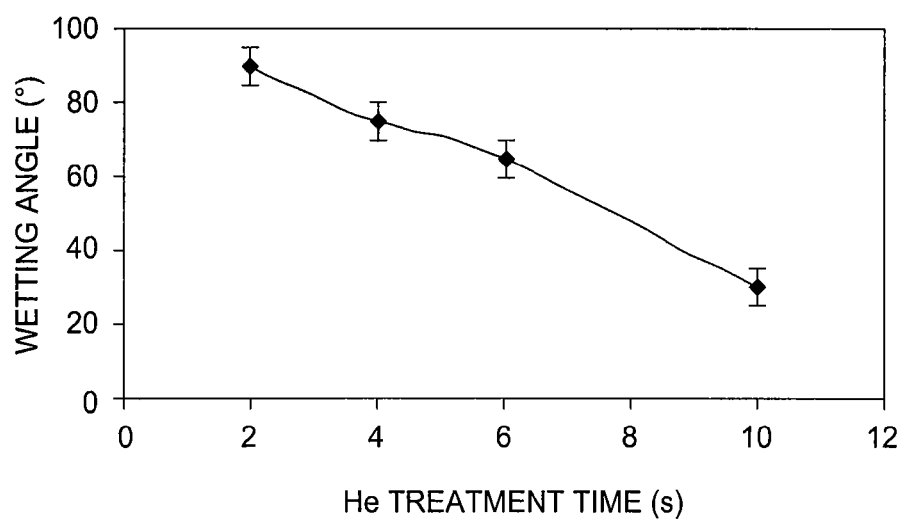
FIG. 6 is a graph showing the wetting angle of a thin OMCTS layer according to an embodiment of the invention versus the length of time of a helium plasma post-treatment of the layer.

In embodiments in which a BARC layer is deposited on the thin layer after wet cleaning the substrate, the thin layer may be helium (or other inert gas) plasma post-treated to adjust the carbon concentration at the surface of the thin layer and the wetting angle of the thin layer. The wetting angle may be decreased to about 70° C. or less to enhance the wetting and deposition of the BARC layer. FIG. 6 shows that the wetting angle decreases with increasing plasma treatment time. Mild processing conditions, i.e., an RF power of between about 30 W and about 100 W and a He flow rate of between about 100 sccm and about 10,000 sccm, are used such that the plasma treatment does not damage the pore-sealing nature of the thin layer.

The thin layer may also be helium plasma post-treated before the deposition of layers other than BARC layers thereon, such as ALD barrier layers, if the surface wetting or contact angle needs to be adjusted. The thin layer may be plasma post-treated with different gases, such as $O_2$, $CO_2$, $N_2O$, $NH_3$, $H_2$, helium, nitrogen, argon, or combinations thereof. The plasma post-treatment can modify the surface nature and characteristics of the layer, such as the surface tension and surface contact angle.

In another embodiment, a method of controlling the critical dimension of a metal line in an interconnect is provided. The method includes depositing a thin layer on a patterned low dielectric constant film, as described in embodiments above. The patterned low dielectric constant film may comprise an oxygen-rich or nitrogen-rich surface before the deposition of the thin layer thereon. After the layer is deposited, the flow of the precursor used to deposit the layer, such as OMCTS, is then terminated, and any remaining precursor is purged from the chamber by introducing carrier gas only, such as He carrier gas, into the chamber. The chamber may be purged or pumped or purged and pumped.

After the chamber is purged and/or pumped, in one embodiment, an oxygen plasma treatment is performed in the chamber to treat the layer that is deposited on the substrate from the precursor and initiate next cycle of deposition, such as an OMCTS deposition. In another embodiment, an $NH_3$ plasma treatment with or without the addition of $H_2$ can be used if a nitrogen-doped oxide or SiN layer is desired. The oxygen plasma may be provided by any oxygen-containing gas capable of generating oxygen radicals that oxidize the surface of the layer. For example, the gas may include $O_2$, $CO_2$, $N_2O$, or a combination thereof. The oxygen-containing gas may be introduced into the chamber at a flow rate. The oxygen-containing gas may be flowed into the chamber for a period of time such as between about 0.1 seconds and about 60 seconds depending on the via/trench pattern profile. The oxygen plasma may be provided by applying a RF power of between about 50 W and about 1000 W in the chamber at a frequency of 13.56 MHz. Mixed frequency RF power can be used. To minimize the impact or damage of plasma treatment on the underlying layer (such as a low dielectric constant film), a low level of high frequency RF power is preferred, such as between about 30 W and about 100 W, which corresponds to between about 0.033 $W/cm^2$ and about 0.082 $W/cm^2$.

The plasma treatment may be terminated by terminating the flow of the oxygen-containing gas into the chamber. Optionally, the thickness of the deposited layer is then measured. The flow of the precursor into the chamber is then resumed to deposit an additional amount of the thin layer. The chamber is purged and then an oxygen plasma treatment as described above is also done. Multiple cycles of deposition, purging, and plasma treatment may be performed until the desired thickness of layer is obtained. By controlling the thickness of the layer deposited in the interconnect, the thickness of a subsequently deposited metal line in the interconnect may be controlled.

In another embodiment, a method of controlling the thickness of a layer to between about 4 Å and about 100 Å on a substrate is provided. The substrate, which may comprise an oxygen-rich or nitrogen-rich surface, is exposed to a silicon-containing precursor in the presence of a plasma to deposit a layer on the substrate, and then the layer is treated with a plasma from $NH_3$ with or without $H_2$ or with a plasma from an oxygen-containing gas selected from the group consisting of $O_2$, $CO_2$, and $N_2O$. The exposure of the substrate to the silicon-containing precursor to deposit a layer and the treatment of the layer with a plasma are repeated until a desired thickness of the layer is obtained.

In a further embodiment, a method of producing a dense dielectric spacer comprising either an oxide or a nitride is provided. The method comprises exposing a patterned substrate comprising a gate, which may comprise an oxygen-rich or nitrogen-rich surface, to a silicon-containing precursor in the presence of a plasma to deposit a layer on the gate and then treating the layer with a plasma from an oxygen-containing gas or nitrogen-containing gas selected from the group consisting of $O_2$, $CO_2$, $N_2O$, a nitrogen-containing gas, and $NH_3$ with or without $H_2$. The silicon-containing precursors and the plasma treatments provided above with respect to the method of controlling the critical dimension of a metal line in an interconnect may also be used for both the method of producing a dense dielectric spacer and the method of controlling the thickness of a layer to between about 4 Å and about 100 Å.

While the foregoing is directed to embodiments of the present invention, other and further embodiments of the invention may be devised without departing from the basic scope thereof, and the scope thereof is determined by the claims that follow.

What is claimed is:

1. A method of forming a patterned semiconductor substrate, comprising:
   forming a dielectric layer comprising carbon on the substrate;
   forming a patterning layer over the dielectric layer;
   patterning the dielectric layer;
   removing the patterning layer, and forming a depleted-carbon surface on the dielectric layer by exposing the substrate to a plasma comprising oxygen;
   recovering the carbon content of the depleted-carbon surface by depositing a thin, conformal, carbon-containing layer over the depleted-carbon surface, wherein the thin, conformal, carbon-containing layer has a carbon content of between about 5 atomic % and about 30 atomic %; and then
   wet cleaning the substrate without loss of critical dimension.

2. The method of claim 1, wherein the dielectric layer is a porous dielectric layer.

3. The method of claim 1, wherein depositing the thin, conformal, carbon-containing layer over the depleted-carbon surface comprises performing a plasma-enhanced chemical vapor deposition (PECVD) process using the same precursors used to deposit the dielectric layer comprising carbon on the substrate.

4. The method of claim 1, wherein the thin, conformal, carbon-containing layer has a thickness between about 4 Å and about 100 Å.

5. The method of claim 1, wherein the thin, conformal, carbon-containing layer has a density higher than the dielectric layer.

6. The method of claim 1, wherein the thin, conformal, carbon-containing layer is a pore-sealing layer.

7. The method of claim 1, wherein the thin, conformal, carbon-containing layer further comprises oxygen.

8. A method of forming a patterned layer on a semiconductor substrate, comprising:
   depositing a porous, dielectric layer comprising silicon and carbon on the substrate by performing a plasma-enhanced chemical vapor deposition (PECVD) process using an organosilicon precursor and a porogen on the substrate and post-treating the substrate to remove the porogen;
   patterning the porous, dielectric layer by forming a photoresist layer over the dielectric layer, patterning the photoresist layer, and transferring the pattern through the dielectric layer;
   removing the photoresist layer, and depleting the carbon concentration of a surface of the dielectric layer, by ashing with a plasma comprising oxygen; and
   recovering the carbon concentration of the surface of the dielectric layer by depositing a thin, dense, conformal layer comprising silicon and carbon directly on the dielectric layer, wherein the thin, dense, conformal layer has a carbon content of between about 5 atomic % and about 30 atomic %.

9. The method of claim 8, wherein the thin, dense, conformal layer comprising silicon and carbon is a pore-sealing layer with a thickness between about 4 Å and about 100 Å.

10. The method of claim 8, wherein the thin, dense, conformal layer further comprises oxygen.

* * * * *